United States Patent
Agan et al.

(10) Patent No.: US 7,400,176 B2
(45) Date of Patent: *Jul. 15, 2008

(54) MAGNETIC OR/NAND CIRCUIT

(75) Inventors: Tom Allen Agan, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 15 days.

This patent is subject to a terminal disclaimer.

(21) Appl. No.: 11/549,363

(22) Filed: Oct. 13, 2006

(65) Prior Publication Data

US 2007/0085569 A1 Apr. 19, 2007

Related U.S. Application Data

(60) Provisional application No. 60/727,321, filed on Oct. 17, 2005.

(51) Int. Cl.
*H03K 19/20* (2006.01)

(52) U.S. Cl. ............... 326/104; 326/37; 326/136
(58) Field of Classification Search ............ 326/37, 326/104, 136

See application file for complete search history.

(56) References Cited

U.S. PATENT DOCUMENTS

2004/0213042 A1* 10/2004 Johnson ............... 365/158
2006/0164124 A1* 7/2006 Koch et al. ............ 326/104

* cited by examiner

*Primary Examiner*—Anh Q Tran
(74) *Attorney, Agent, or Firm*—Thomas, Kayden, Horstemeyer & Risley

(57) ABSTRACT

A magnetic OR/NAND circuit has a first, a second, a third, and a fourth magnetic transistor. These four magnetic transistors that work as the ordinary transistors can be turned on or turned off by the control of several metal devices respectively disposed around the magnetic transistors. The 'OR' and 'NAND' logic functions of the binary system can be implemented by the control of these metal devices.

17 Claims, 4 Drawing Sheets

MAGNETIC OR/NAND CIRCUIT

CROSS-REFERENCE TO RELATED APPLICATION

This application claims the priority benefit of provisional application Ser. No. 60/727,321, filed on Oct. 17, 2005, the full disclosure of which is incorporated herein by reference.

BACKGROUND

1. Field of Invention

The present invention relates to an OR/NAND circuit. More particularly, the present invention relates to an OR/NAND circuit configured by several magnetic transistors.

2. Description of Related Art

'OR' and 'NAND' logic circuits are very important for IC circuit design. The designer can combine these two logic circuits with other logic circuits to implement the required functions.

FIG. 1 is a CMOS circuit with the NAND logic function of the prior art. The CMOS circuit has two PMOS transistors 100 and 130 coupled in parallel, and two NMOS transistors 160 and 190 coupled in series. The NMOS transistor 190 couples to the low voltage end 140, and the PMOS transistors 100 and 130 couple to the high voltage end 120. The input signal 'X' at the input end 110 controls the PMOS transistor 100 and NMOS transistor 160. The Input signal 'Y' at the input end 150 controls the PMOS transistor 130 and NMOS transistor 190. The CMOS circuit generates the NAND logic function (output=(X·Y)') at the output end 170.

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

Therefore, the GMR effect can be used to design the magnetic transistor. Thus, magnetic transistors can further be used to integrate a magnetic OR/NAND circuit without the expensive process and equipment. The magnetic OR/NAND circuit can be designed and manufactured with short programming time and high density.

For the foregoing reasons, there is a need to have a magnetic OR/NAND circuit integrated by magnetic transistors.

SUMMARY

It is therefore an aspect of the present invention to provide an OR/NAND circuit device implemented by magnetic transistors.

According to one preferred embodiment of the present invention, the magnetic OR/NAND circuit has a first, a second, a third, and a fourth magnetic transistor. The first magnetic transistor has a first magnetic section and a second magnetic section, wherein the first magnetic section couples to a high voltage end, and the second magnetic section couples to an output end. The second magnetic transistor has a third magnetic section and a fourth magnetic section, wherein the fourth magnetic section couples to the second magnetic section of the first magnetic transistor and the output end. The third magnetic transistor has a fifth magnetic section and a sixth magnetic section, wherein the fifth magnetic section couples to a low voltage end, and the sixth magnetic section couples to the third magnetic section of the second magnetic transistor. The fourth magnetic transistor has a seventh magnetic section and an eighth magnetic section, wherein the seventh magnetic section couples to the high voltage end, and the eighth magnetic section couples to the second magnetic section of the first magnetic transistor, the fourth magnetic section of the second magnetic transistor and the output end.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
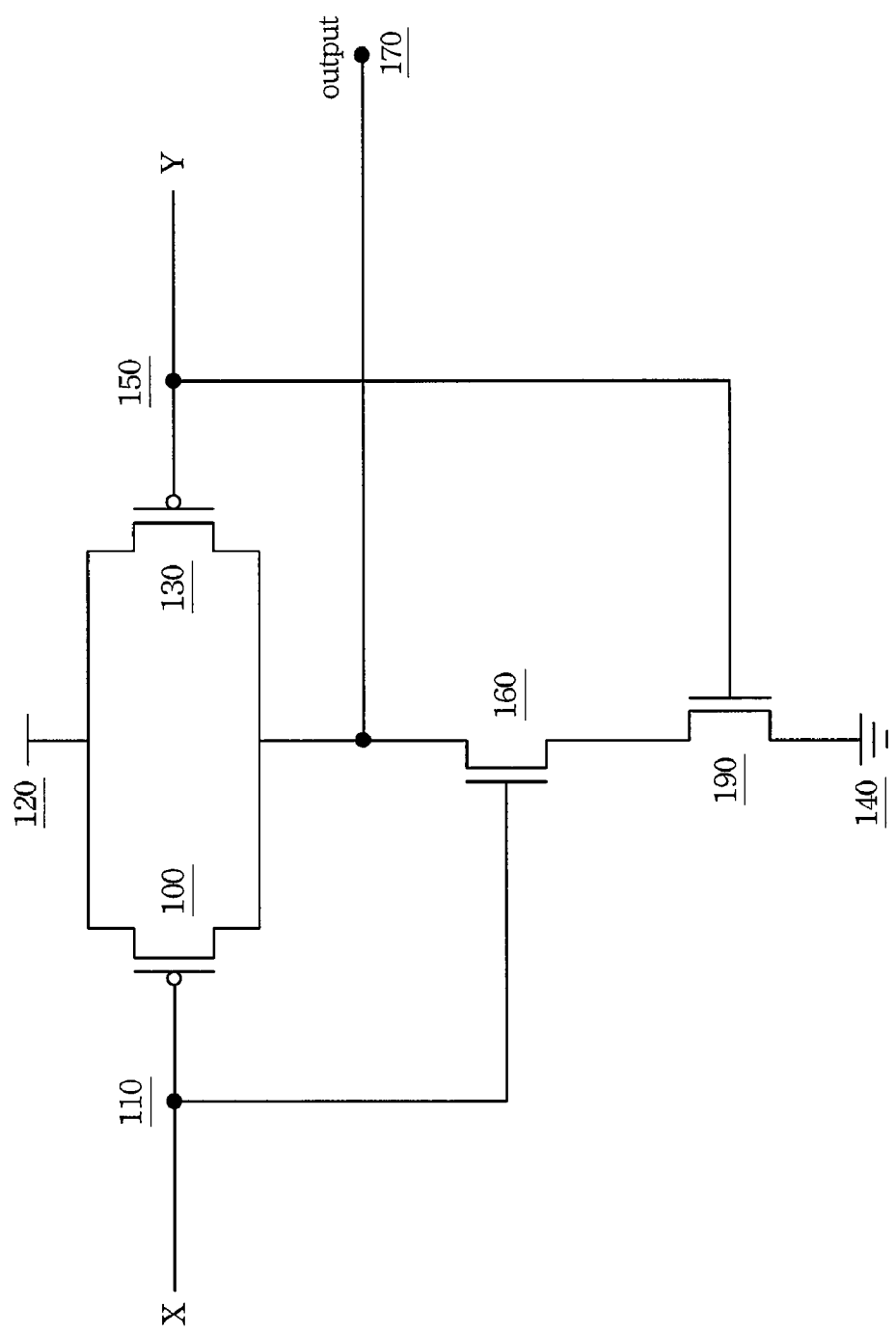
FIG. 1 is a CMOS circuit with the NAND logic function of the prior art.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Figure 2:
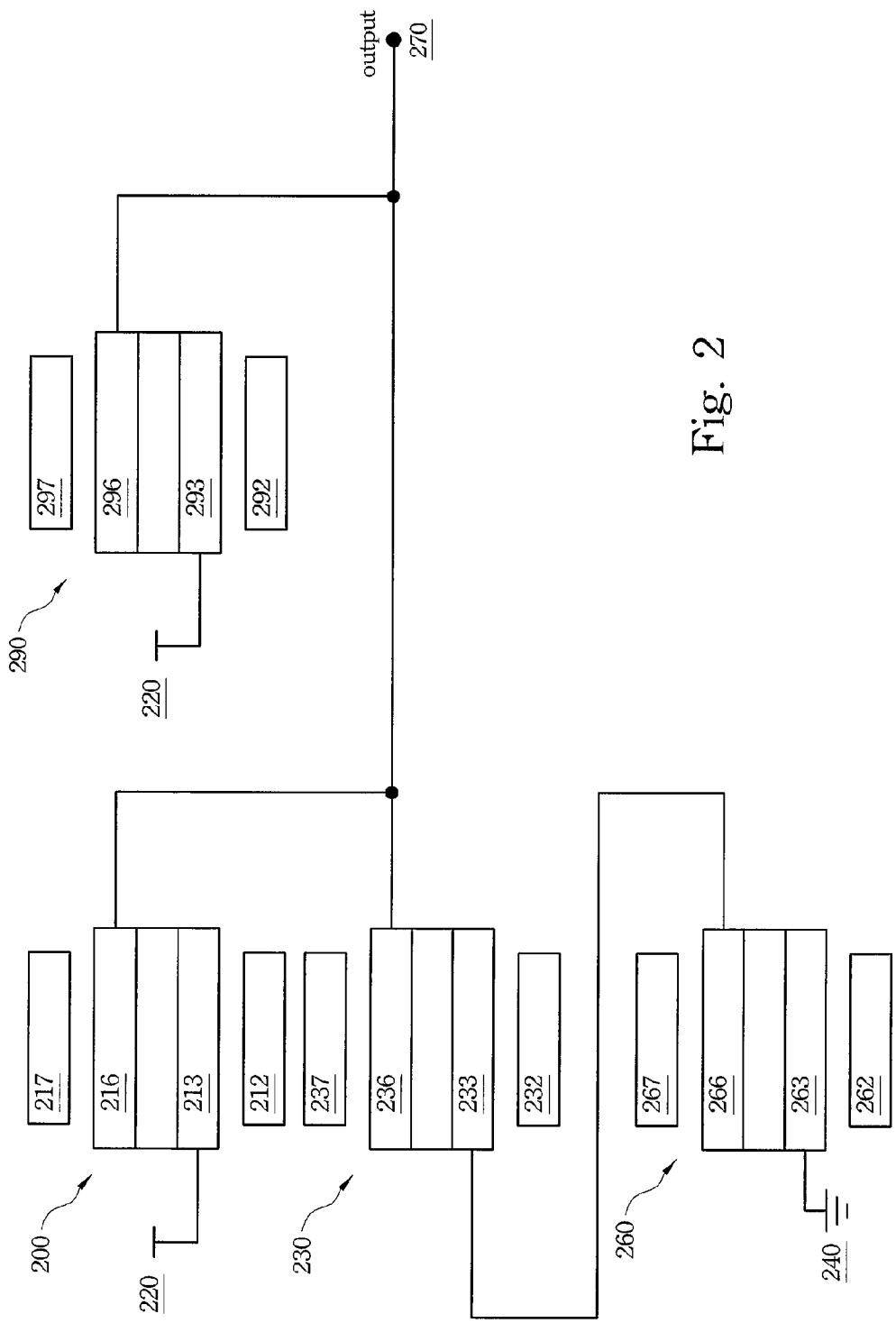
FIG. 2 is the magnetic OR/NAND circuit according to the embodiment of this invention.

FIG. 2 is the magnetic OR/NAND circuit according to the embodiment of this invention. The magnetic OR/NAND circuit has a first magnetic transistor 200, a second magnetic transistor 230, a third magnetic transistor 260, and a fourth magnetic transistor 290. The first magnetic transistor 200 has a first magnetic section 213 and a second magnetic section 216, wherein the first magnetic section 213 couples to a high voltage end 220, and the second magnetic section 216 couples to an output end 270. The second magnetic transistor 230 has a third magnetic section 233 and a fourth magnetic section 236, wherein the fourth magnetic section 236 couples to the second magnetic section 216 and the output end 270. The third magnetic transistor 260 has a fifth magnetic section 263 and a sixth magnetic section 266, wherein the fifth magnetic section 263 couples to a low voltage end 240, and the sixth magnetic section 266 couples to the third magnetic section 233 of the second magnetic transistor 230. The fourth magnetic transistor 290 has a seventh magnetic section 293 and an eighth magnetic section 296, wherein the seventh magnetic section 293 couples to the high voltage end 220, and the eighth magnetic section 296 couples to the second magnetic section 216 of the first magnetic transistor 200, the fourth magnetic section 236 of the second magnetic transistor 230 and the output end 270.

The magnetic OR/NAND circuit further comprises a plurality of metal devices 212, 217, 232, 237, 262, 267, 292 and 297 respectively disposed around the magnetic sections 213, 216, 233, 236, 263, 266, 293 and 296. The metal devices 212, 217, 232, 237, 262, 167, 292 and 297 are arranged to respectively control dipoles of the magnetic sections 213, 216, 233, 236, 263, 266, 293 and 296. For example, the first magnetic transistor 200 has metal devices 212 and 217 respectively disposed around the magnetic sections 213 and 216. The metal device 212 is arranged to control the dipole of the magnetic section 213, and the metal device 217 is arranged to control the dipole of the magnetic section 216.

By the description above, the designer can use the metal devices to control the dipoles of the magnetic sections. The designer can further use the dipoles of these two magnetic sections of one magnetic transistor to control the conductivity between these two magnetic sections.

For example, when dipoles of the first magnetic section 213 and the second magnetic section 216 are the same, the first magnetic section 213 and the second magnetic section 216 are conductive, when dipoles of the first magnetic section 213 and the second magnetic section 216 are different, the first magnetic section 213 and the second magnetic section 216 are not conductive.

When dipoles of the third magnetic section 233 and the fourth magnetic section 236 are the same, the third magnetic section 233 and the fourth magnetic section 236 are conductive, when dipoles of the third magnetic section 233 and the fourth magnetic section 236 are different, the third magnetic section 233 and the fourth magnetic section 236 are not conductive.

When dipoles of the fifth magnetic section 263 and the sixth magnetic section 266 are the same, the fifth magnetic section 263 and the sixth magnetic section 266 are conductive, when dipoles of the fifth magnetic section 263 and the sixth magnetic section 266 are different, the fifth magnetic section 263 and the sixth magnetic section 266 are not conductive.

When dipoles of the seventh magnetic section 293 and the eighth magnetic section 296 are the same, the seventh magnetic section 293 and the eighth magnetic section 296 are conductive, when dipoles of the seventh magnetic section 293 and the eighth magnetic section 296 are different, the seventh magnetic section 293 and the eighth magnetic section 296 are not conductive.

By the description above, characteristics of the magnetic transistor can be used to implement a circuit with some logic functions.

Figure 3:
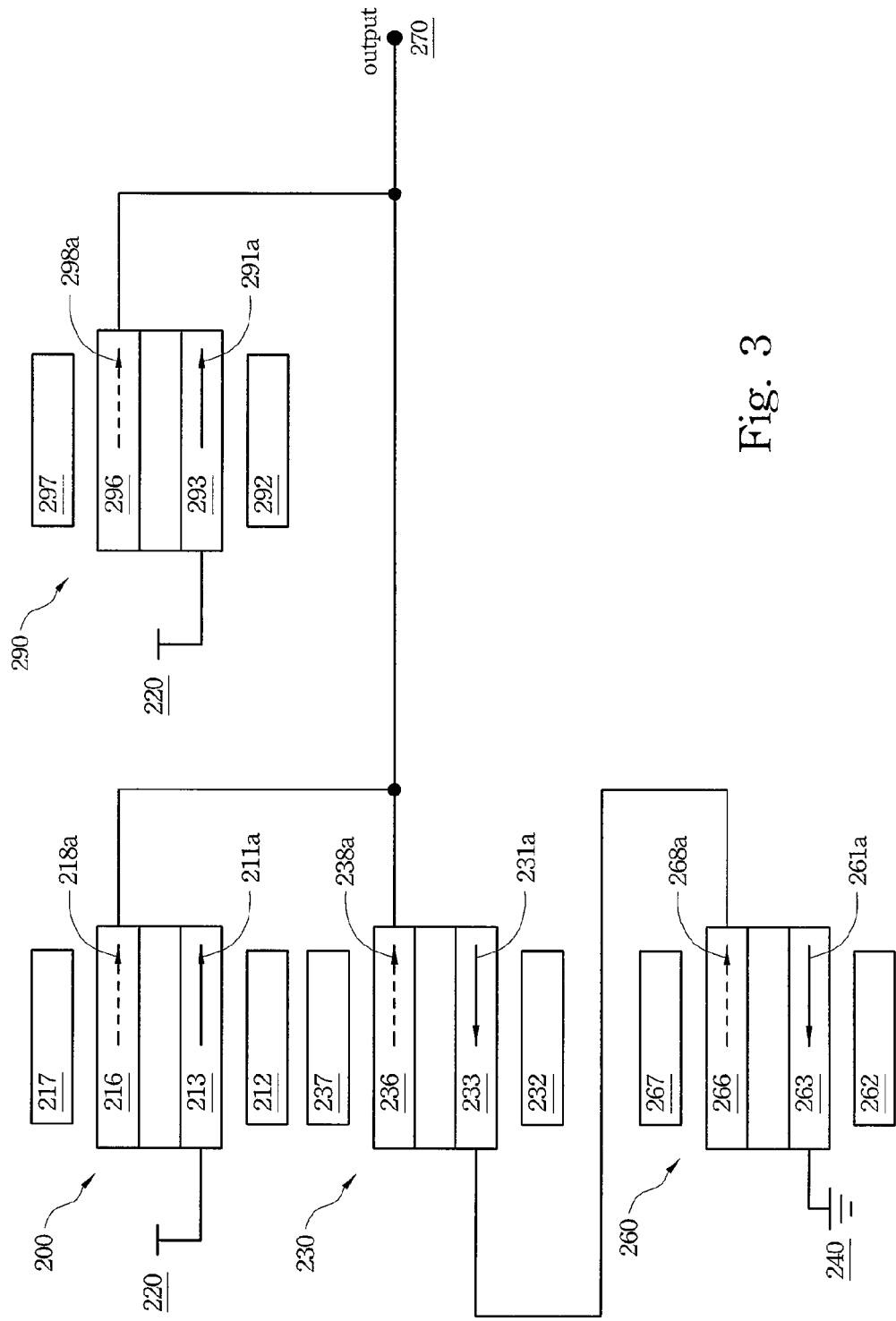
FIG. 3 is the magnetic OR/NAND circuit operating OR logic function of the binary system according to the embodiment of this invention.

FIG. 3 is the magnetic OR/NAND circuit operating OR logic function of the binary system according to the embodiment of this invention. The dipoles 211a and 291a of the first and seventh magnetic sections 213 and 293 are a first dipole, and dipoles 231a and 261a of the third and fifth magnetic sections 233 and 263 are a second dipole. Therefore, the magnetic OR/NAND circuit can generate different data at the output end 270 by changing the dipoles 218a, 238a, 268a and 298a of the second, fourth, sixth, and eighth magnetic sections 216, 236, 266, and 296.

The magnetic OR/NAND circuit of FIG. 3 has OR logic function of the binary system as describe bellow.

The OR logic function is:

output=$X+Y$

The truth table of the OR logic function of the binary system according to the embodiment of this invention is:

| output | Dipole Y = 1($\rightarrow$) | Dipole Y = 0($\leftarrow$) |
|---|---|---|
| Dipole X = 1($\rightarrow$) | 1 | 1 |
| Dipole X = 0($\leftarrow$) | 1 | 0 |

Wherein 'output' is the data outputted at the output end 270, 'X' is dipoles of the magnetic sections 216 and 236, 'Y' is dipoles of the magnetic sections 266 & 296. The symbols '$\rightarrow$' and '$\leftarrow$' are arranged to respectively represent the first dipole and the second dipole. How to use dipoles of X (dipoles of the magnetic sections 216 and 236) and Y (dipoles of the magnetic sections 266 and 296) to create the OR logic function is described as bellow.

When dipoles 218a, 238a, 268a, and 298a of the second, fourth, sixth and eighth magnetic sections 216, 236, 266, and 296 at FIG. 3 are the first dipole ($\rightarrow$) that represents data '1' of the binary system, the data outputted at the output end 270 is '1' of the binary system.

When dipoles of the second and fourth magnetic sections 216 and 236 are the first dipole ($\rightarrow$) that represents data '1' of the binary system, and dipoles of the sixth and eighth magnetic sections 266 and 296 are the second dipole ($\leftarrow$) that represents data '0' of the binary system, the data outputted at the output end 270 is '1' of the binary system (not shown).

When dipoles of the second and fourth magnetic sections 216 and 236 are the second dipole ($\leftarrow$) that represents data '0' of the binary system, and dipoles of the sixth and eighth magnetic sections 266 and 296 are the first dipole ($\rightarrow$) that represents data '1' of the binary system, the data outputted at the output end 270 is '1' of the binary system (not shown).

When dipoles of the second, fourth, sixth and eighth magnetic sections 216, 236, 266, 296 are the second dipole ($\leftarrow$) that represents data '0' of the binary system, the data outputted at the output end 270 is '0' of the binary system (not shown).

Figure 4:
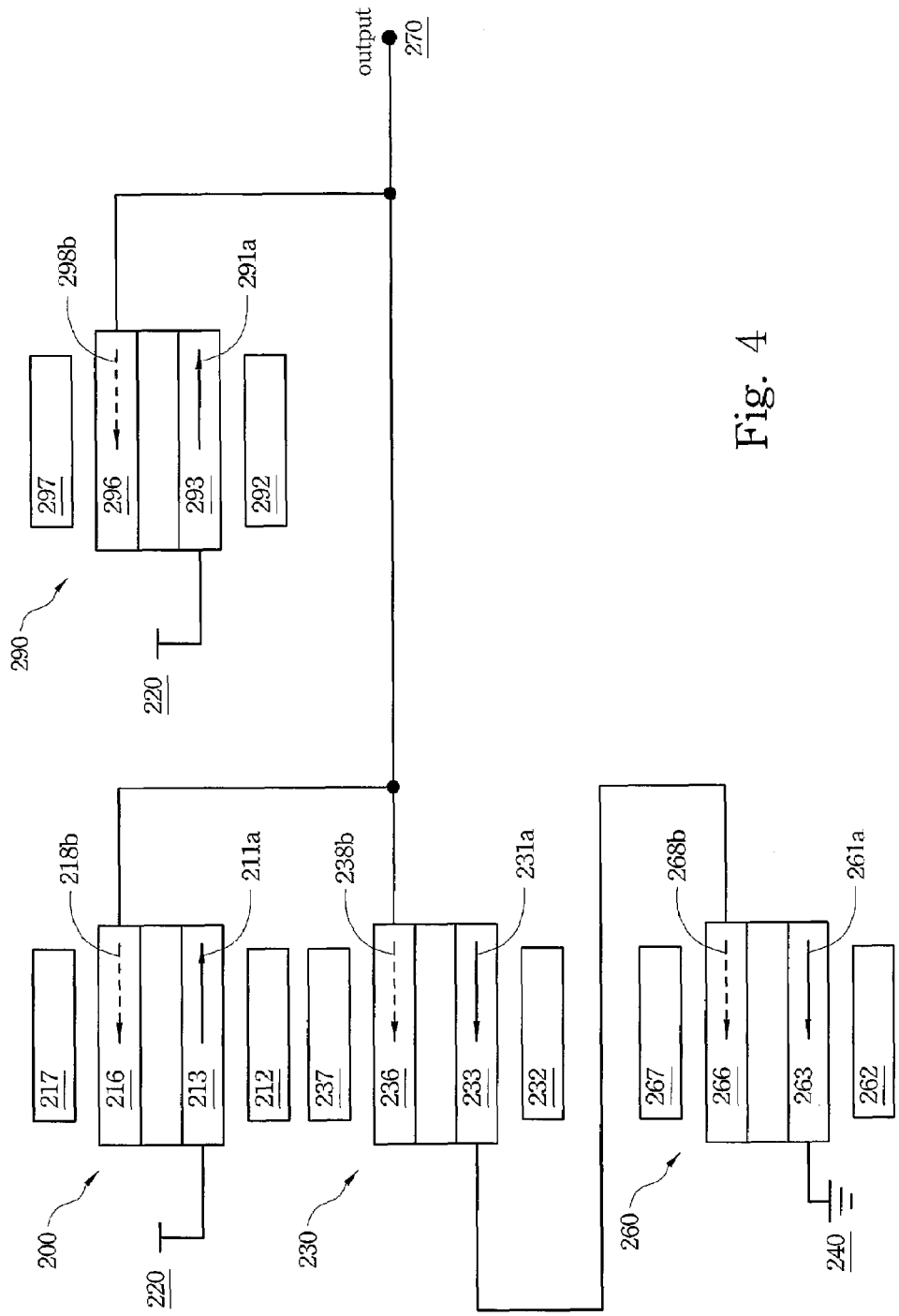
FIG. 4 is the magnetic OR/NAND circuit operating NAND logic function of the binary system according to the embodiment of this invention.

FIG. 4 is the magnetic OR/NAND circuit operating NAND logic function of the binary system according to the embodiment of this invention. The dipoles 211a and 291a of the first and seventh magnetic sections 213 and 293 are a first dipole, and dipoles 231a and 261a of the third and fifth magnetic sections 233 and 263 are a second dipole. Therefore, the magnetic OR/NAND circuit can generate different data at the output end 270 by changing the dipoles 218b, 238b, 268b and 298b of the second, fourth, sixth, and eighth magnetic sections 216, 236, 266, and 296.

Therefore, the magnetic OR/NAND circuit can operate OR or NAND logic function by the same device. On the contrary, the ordinary CMOS circuit with OR logic function is different from the CMOS circuit with NAND function.

The magnetic OR/NAND circuit of FIG. 4 has NAND logic function of the binary system as describe bellow.

The NAND logic function is:

output=$(X \cdot Y)'$

The truth table of NAND logic function of the binary system according to the embodiment of this invention is:

| output | Dipole Y = 1(←) | Dipole Y = 0(→) |
|---|---|---|
| Dipole X = 1(←) | 0 | 1 |
| Dipole X = 0(→) | 1 | 1 |

Wherein 'output' is the data outputted at the output end 270, 'X' is dipoles of the magnetic sections 216 and 236, 'Y' is dipoles of the magnetic sections 266 & 296. The symbols '→' and '←' are arranged to respectively represent the first dipole and the second dipole. How to use dipoles of X (dipoles of the magnetic sections 216 and 236) and Y (dipoles of the magnetic sections 266 and 296) to create the NOR logic function is described as bellow.

When dipoles 218b 238b, 268b, and 298b of the second, fourth, sixth and eighth magnetic sections 216, 236, 266, and 296 at FIG. 4 are the second dipole (←) that represents data '1' of the binary system, the data outputted at the output end 270 is '0' of the binary system.

When dipoles of the second and fourth magnetic sections 216 and 236 are the second dipole (←) that represents data '1' of the binary system, and dipoles of the sixth and eighth magnetic sections 266 and 296 are the first dipole (→) that represents data '0' of the binary system, the data outputted at the output end 270 is '1' of the binary system (not shown).

When dipoles of the second and fourth magnetic sections 216 and 236 are the first dipole (→) that represents data '0' of the binary system, and dipoles of the sixth and eighth magnetic sections 266 and 296 are the second dipole (←) that represents data '1' of the binary system, the data outputted at the output end 270 is '1' of the binary system (not shown).

When dipoles of the second, fourth, sixth and eighth magnetic sections 216, 236, 266, 296 are the first dipole (→) that represents data '0' of the binary system, the data outputted at the output end 270 is '1' of the binary system (not shown).

In order to corporate with the ordinary integrated circuits of semiconductor, a voltage of the low voltage end 240 is about 0 volt, and a voltage of the high voltage end 220 is about 2.5 volt, 3.3 volt or 5 volt.

The symbols '→' and '←' here are just arranged to respectively represent the dipoles of the magnetic sections, not arranged to restrict the dipole directions. In the magnetic transistor circuit, each magnetic transistor has a conductive section between two magnetic sections. The conductivity of the conductive section can be controlled by the dipoles of these two magnetic sections. Therefore, the magnetic OR/NAND can be implemented by the description above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic OR/NAND circuit, comprising:
   a first magnetic transistor having a first magnetic section and a second magnetic section, wherein the first magnetic section couples to a high voltage end, and the second magnetic section couples to an output end;
   a second magnetic transistor having a third magnetic section and a fourth magnetic section, wherein the fourth magnetic section couples to the second magnetic section of the first magnetic transistor and the output end;
   a third magnetic transistor having a fifth magnetic section and a sixth magnetic section, wherein the fifth magnetic section couples to a low voltage end, and the sixth magnetic section couples to the third magnetic section of the second magnetic transistor; and
   a fourth magnetic transistor having a seventh magnetic section and a eighth magnetic section, wherein the seventh magnetic section couples to the high voltage end, and the eighth magnetic section couples to the second magnetic section of the first magnetic transistor, the fourth magnetic section of the second magnetic transistor and the output end.

2. The magnetic OR/NAND circuit of claim 1, further comprising a plurality of metal devices respectively disposed around the magnetic sections, wherein the metal devices are arranged to respectively control dipoles of the magnetic sections.

3. The magnetic OR/NAND circuit of claim 1, wherein when dipoles of the first magnetic section and the second magnetic section are the same, the first magnetic section and the second magnetic section are conductive, when dipoles of the first magnetic section and the second magnetic section are different, the first magnetic section and the second magnetic section are not conductive.

4. The magnetic OR/NAND circuit of claim 1, wherein when dipoles of the third magnetic section and the fourth magnetic section are the same, the third magnetic section and the fourth magnetic section are conductive, when dipoles of the third magnetic section and the fourth magnetic section are different, the third magnetic section and the fourth magnetic section are not conductive.

5. The magnetic OR/NAND circuit of claim 1, wherein when dipoles of the fifth magnetic section and the sixth magnetic section are the same, the fifth magnetic section and the sixth magnetic section are conductive, when dipoles of the fifth magnetic section and the sixth magnetic section are different, the fifth magnetic section and the sixth magnetic section are not conductive.

6. The magnetic OR/NAND circuit of claim 1, wherein when dipoles of the seventh magnetic section and the eighth magnetic section are the same, the seventh magnetic section and the eighth magnetic section are conductive, when dipoles of the fifth magnetic section and the sixth magnetic section are different, the seventh magnetic section and the eighth magnetic section are not conductive.

7. The magnetic OR/NAND circuit of claim 1, wherein dipoles of the first and seventh magnetic sections are a first dipole, and dipoles of the third and fifth magnetic sections are a second dipole.

8. The magnetic OR/NAND circuit of claim 1, wherein the magnetic OR/NAND circuit has OR logic function of the binary system.

9. The magnetic OR/NAND circuit of claim 8, wherein when dipoles of the second, fourth, sixth and eighth magnetic sections are the first dipole that represents data '1' of the binary system, the data outputted at the output end is '1' of the binary system.

10. The magnetic OR/NAND circuit of claim 8, wherein when dipoles of the second and fourth magnetic sections are the first dipole that represents data '1' of the binary system, and dipoles of the sixth and eighth magnetic sections are the second dipole that represents data '0' of the binary system, the data outputted at the output end is '1' of the binary system.

11. The magnetic OR/NAND circuit of claim 8, wherein when dipoles of the second and fourth magnetic sections are the second dipole that represents data '0' of the binary system, and dipoles of the sixth and eighth magnetic sections are the first dipole that represents data '1' of the binary system, the data outputted at the output end is '1' of the binary system.

12. The magnetic OR/NAND circuit of claim 8, wherein when dipoles of the second, fourth, sixth and eighth magnetic sections are the second dipole that represents data '0' of the binary system, the data outputted at the output end is '0' of the binary system.

13. The magnetic OR/NAND circuit of claim 1, wherein the magnetic OR/NAND circuit has NAND logic function of the binary system.

14. The magnetic OR/NAND circuit of claim 13, wherein when dipoles of the second, fourth, sixth and eighth magnetic sections are the second dipole that represents data '1' of the binary system, the data outputted at the output end is '0' of the binary system.

15. The magnetic OR/NAND circuit of claim 13, wherein when dipoles of the second and fourth magnetic sections are the second dipole that represents data '1' of the binary system, and dipoles of the sixth and eighth magnetic sections are the first dipole that represents data '0' of the binary system, the data outputted at the output end is '1' of the binary system.

16. The magnetic OR/NAND circuit of claim 13, wherein when dipoles of the second and fourth magnetic sections are the first dipole that represents data '0' of the binary system, and dipoles of the sixth and eighth magnetic sections are the second dipole that represents data '1' of the binary system, the data outputted at the output end is '1' of the binary system.

17. The magnetic OR/NAND circuit of claim 13, wherein when dipoles of the second, fourth, sixth and eighth magnetic sections are the first dipole that represents data '0' of the binary system, the data outputted at the output end is '1' of the binary system.

* * * * *